(12) United States Patent
Nozawa et al.

(10) Patent No.: US 6,762,000 B2
(45) Date of Patent: Jul. 13, 2004

(54) PHASE SHIFT MASK BLANK, PHOTO MASK BLANK AND MANUFACTURING APPARATUS AND METHOD OF BLANKS

(75) Inventors: Osamu Nozawa, Fuchu (JP); Masaru Mitsui, Yamanashi-ken (JP); Hitoshi Ootsuka, Tokyo (JP); Hideaki Mitsui, Fuchu-shi (JP)

(73) Assignee: Hoya Corporation (JP)

( * ) Notice: Subject to any disclaimer, the term of this patent is extended or adjusted under 35 U.S.C. 154(b) by 161 days.

(21) Appl. No.: 09/951,816

(22) Filed: Sep. 12, 2001

(65) Prior Publication Data
US 2002/0110741 A1 Aug. 15, 2002

(30) Foreign Application Priority Data
Sep. 12, 2000 (JP) .................................. 2000-277260

(51) Int. Cl.[7] .................................................. G03F 9/00
(52) U.S. Cl. ........................................................ 430/5
(58) Field of Search ............................................ 430/5

(56) References Cited

U.S. PATENT DOCUMENTS 5,914,202 A  * 6/1999 Nguyen et al. ............. 430/5

FOREIGN PATENT DOCUMENTS

JP   8-305002   11/1996
JP   9-015831   1/1997

* cited by examiner

Primary Examiner—Mark F. Huff
Assistant Examiner—Saleha Mohamedulla
(74) Attorney, Agent, or Firm—Cook, Alex, McFarron, Manzo, Cummings & Mehler, Ltd.

(57) ABSTRACT

There is provided a manufacturing apparatus and method able to manufacture a phase shift mask blank in which a total number of particles and pinholes having a diameter larger than about a half of an exposure wavelength in a light semi-transmission film is 0.1 or less per square centimeter. In a DC magnetron sputtering apparatus for manufacturing a halftone phase shift mask blank, for example, a target plane is disposed downwards with respect to a gravity direction, a whole-surface erosion cathode is used, a corner portion 5a of an end of a target and a corner portion of an earth shield are chamfered (R processed), a target end 5b, an exposed backing plate surface 4b and the surface of an earth shield 12 are roughened, and the earth shield 12 is disposed above a target plane d (on a backing plate side).

12 Claims, 2 Drawing Sheets

(b) LIGHT AMPLITUDE DISTRIBUTION OF MASK (c) LIGHT STRENGTH DISTRIBUTION ON TRANSFER MATERIAL

PHASE SHIFT MASK BLANK, PHOTO MASK BLANK AND MANUFACTURING APPARATUS AND METHOD OF BLANKS

This application claims the Paris convention priority of Japanese patent application 2000 277260 filed on Sep. 12, 2000, the entire disclosure of which is incorporated herein by reference.

BACKGROUND OF THE INVENTION i) Field of the Invention

The present invention relates to a phase shift mask blank which is suitable particularly for ArF or $F_2$ excimer laser, and a manufacturing apparatus and method of the phase shift mask blank.

ii) Description of the Related Art

In recent years, it has been clarified that high resolution and focus depth are two important properties required for photolithography but are in a contradictory relation with each other, and that a practical resolution cannot be enhanced only by high NA and short wavelength of a lens of an exposure apparatus (Monthly Semiconductor World 1990.12, Applied Physics Vol. 60, Nov. 1991, and the like).

Under such situation, phase shift lithography has been noted as the next-generation photolithography technique, and partially brought to practical use. The phase shift lithography is a method for enhancing the resolution of photolithography by change only of a mask without changing an optical system. When a phase difference is applied between exposure lights transmitted through the photo mask, mutual interference of the transmitted lights can be utilized to rapidly enhance the resolution.

The phase shift mask is a mask for using light strength information together with phase information. Various types of the masks are known such as Levenson type, auxiliary pattern type, and self-matching type (edge emphasizing type). These phase shift masks have a complicated constitution and require a high degree of manufacturing technique as compared with the conventional photo mask which has only the light strength information.

In recent years, a so-called halftone type phase shift mask has been developed as one of the phase shift masks.

In the halftone phase shift mask, a light semi-transmission portion has two functions: a shield function of substantially shielding the exposure light; and a phase shift function of shifting (usually reversing) a light phase. Therefore, it is unnecessary to separately form a shield film pattern and phase shift film pattern. This type of phase shift mask is simple in constitution and easy in manufacturing.

For the halftone phase shift mask, as shown in FIG. 4, a mask pattern formed on a transparent substrate 100 is constituted of a light transmission portion (transparent substrate exposed portion) 200 for transmitting a light which is strong enough to substantially contribute to exposure, and a light semi-transmission portion (shield and phase shifter portion) 300 for transmitting a light which is not strong enough to substantially contribute to the exposure (FIG. 4A). Additionally, the phase of the light transmitted to the light semi-transmission portion is shifted, and the light semi-transmission portion is brought to a substantially reversed relation with respect to the phase of the light transmitted through the light transmission portion (FIG. 4B). The lights transmitted in the vicinity of a boundary between the light semi-transmission portion and the light transmission portion and turned to the opposite portions by diffraction phenomenon cancel each other. Thereby, light strength in the boundary is substantially set to zero, and contrast, that is, resolution of the boundary is enhanced (FIG. 4C).

The light semi-transmission portion (phase shift layer) in the halftone phase shift mask or blank needs to have a required optimum value with respect to both transmittance and phase shift amount. Concretely, (1) the transmittance in an exposure wavelength of KrF, ArF, or $F_2$ excimer laser, or the like can be adjusted in a range of 3 to 20%, (2) a phase angle can be adjusted usually to a value in the vicinity of 180° in the exposure wavelength, and (3) the transmittance needs to be usually testable in a range of 65% or less in test wavelengths such as 257 nm, 266 nm, 364 nm, and 488 nm.

In recent years, there has been a demand for a finer processing of a device, or the like, and shortening of an exposure wavelength for use in the device has been advanced. On the other hand, influences of a particle adhering to the mask blank and a pinhole formed in the mask have been increasingly regarded as problems. That is, for example, by generation of arc in a film formation apparatus during film formation, or other causes, a particle with a particle diameter of about one micron or less is sometimes mixed in the light semi-transmission film at a ratio of about 0.05 to 0.5 particle per one square centimeter. Moreover, when there is a fine groove or hole in the surface of a target, the particle with a particle diameter of about several microns or less is sometimes mixed in the light semi-transmission film. When the particle mixed in the light semi-transmission film falls out in a cleaning process, the pinhole is generated. Therefore, in order to prepare the mask blanks having less pinholes, it is necessary to reduce the number of particles during formation of the light semi-transmission film.

Additionally, in conventional mask blanks for i-ray, or KrF excimer laser, in which a relatively long wavelength is used as the exposure wavelength, there are many particles or pinholes. Therefore, the blanks cannot be applied to some of photo mask blanks for KrF, in which a pattern finer than a conventional pattern is formed, or mask blanks for a short wavelength of ArF or $F_2$ excimer laser.

With the shortening of the exposure wavelength, a property of the particle or the pinhole, required for the mask blanks, becomes stricter. It is necessary for practical use of the mask blanks for the short wavelength of the ArF or $F_2$ excimer laser to reduce the number of particles or pinholes having a diameter larger in size than about a half of the exposure wavelength as much as possible.

SUMMARY OF THE INVENTION

The present invention has been developed under the aforementioned background, and a first object thereof is to provide a phase shift mask blank in which the number of particles or pinholes each having a diameter larger than a diameter substantially equivalent in size to an exposure wavelength is reduced as much as possible.

Moreover, a second object of the present invention is to provide a manufacturing apparatus and method able to manufacture the phase shift mask blank in which the number of particles or pinholes each having the diameter larger than the diameter equivalent in size to the exposure wavelength is reduced as much as possible.

Furthermore, a third object of the present invention is to provide a photo mask blank in which the number of particles or pinholes is reduced as much as possible.

Additionally, a fourth object of the present invention is to provide a manufacturing apparatus and method which can manufacture the photo mask blank having the number of particles or pinholes reduced as much as possible.

To achieve the aforementioned objects, the present invention has the following constitutions.

(Constitution 1) A manufacturing method of a photo mask blank having a thin film for forming a pattern on a transparent substrate, wherein during sputtering formation of the thin film, the surface of a target is directed downwards and the surface of a substrate is directed upwards with respect to a gravity direction, and a peripheral edge of the substrate is shielded in order to prevent film formation.

Particularly, a manufacturing method of a halftone phase shift mask blank having a light semi-transmission film on a transparent substrate, wherein during sputtering formation of the light semi-transmission film, the surface of a target is directed downwards and the surface of a substrate is directed upwards with respect to a gravity direction, and a peripheral edge of the substrate is shielded in order to prevent film formation.

(Constitution 2) A manufacturing method of a photo mask blank having a thin film for forming a pattern on a transparent substrate, comprising a step of:

manufacturing the thin film using a DC magnetron sputtering apparatus comprising at least a sputtering target, a magnetron cathode with the target attached thereto, a substrate holder disposed opposite to the target, and a shield disposed on an inner wall of a vacuum tank inside the vacuum tank, wherein the surface of a target is directed downwards with respect to a gravity direction, and the apparatus has a mechanism for reducing film formation on a non-sputtered area on the target and the surface of the shield.

(Constitution 3) The manufacturing method according to constitution 2 wherein the mechanism for reducing the film formation onto the non-sputtered area on the target comprises a mechanism in which a whole-surface erosion cathode is used as the magnetron cathode, a mechanism for shielding the non-sputtered area on the target, or a mechanism for roughening the surface of a non-sputtered portion on the target.

(Constitution 4) The manufacturing method according to constitution 3 wherein the mechanism for reducing the film formation onto the non-sputtered area on the target further comprises a mechanism for forming a corner in the target into a curved surface, and roughening an end surface of the target.

(Constitution 5) The manufacturing method according to constitution 2 wherein in the mechanism for reducing the film formation on the shield surface, the shield is kept at a constant temperature, and a shape of the shield is designed so that a relative film formation speed t in the following equation (i) in at least a shield position in the vicinity of the target is prevented from being larger than a value in a position on the substrate:

$$t = \cos\theta_1 \times \sin(\theta_1 - \theta_2)/r^2 \tag{i}$$

(in the equation (i), r denotes a distance between a target center and a shield position, $\theta_1$ denotes an angle of a line connecting the target center to the shield position with respect to a normal of a target plane, $\theta_2$ denotes an angle of a shield plane with respect to the normal of the target plane, and t denotes the relative film formation speed in the shield position defined by r and $\theta_1$).

(Constitution 6) The manufacturing method according to constitution 5 wherein in the mechanism for reducing the film formation onto the shield surface comprises a mechanism for forming a corner in the shield into a curved surface, roughening the surface of the shield, and disposing an earth shield above the target plane.

(Constitution 7) The manufacturing method according to any one of constitutions 2 to 6 wherein the apparatus further comprises a backing plate to which the target is to be attached, and the surface of the backing plate is roughened.

(Constitution 8) The manufacturing method according to any one of constitutions 2 to 7 wherein the apparatus further comprises a shield plate for preventing the film from being formed on a peripheral portion of the substrate.

(Constitution 9) A photo mask blank manufactured using the manufacturing method according to any one of constitutions 1 to 8.

(Constitution 10) A photo mask blank having a thin film for forming a pattern on a transparent substrate, wherein a total number of particles and pinholes having a diameter larger than a diameter substantially equivalent in size to an exposure wavelength for use in the blank as a mask is 0.1 or less per square centimeter.

(Constitution 11) A photo mask blank having a thin film for forming a pattern on a transparent substrate, wherein an exposure wavelength for use in the blank as a mask has a center wavelength of 193 nm or less, and a total number of particles and pinholes having a diameter larger than 0.2 $\mu$m is 0.1 or less per square centimeter.

(Constitution 12) The photo mask blank according to constitution 10 or 11 wherein the thin film for forming the pattern is a light semi-transmission film, and the photo mask blank is a halftone phase shift mask blank.

(Constitution 13) A manufacturing apparatus of a photo mask blank for carrying out the manufacturing method according to any one of constitutions 1 to 8.

(Constitution 14) A photo mask manufactured by patterning a thin film in the photo mask blank according to any one of constitutions 9 to 12.

(Constitution 15) A pattern transfer method using the photo mask according to constitution 14 to transfer a pattern.

In the constitution 1, when the target plane is directed downwards with respect to the gravity direction, the substrate surface necessarily turns upwards, and the film is formed on the whole surface and side surface of the substrate, but the peripheral edge of the substrate is shielded to prevent the film formation as in the constitution 1. Thereby, particles generated when the film is stripped by handling or cleaning after forming the light semi-transmission film can remarkably be reduced, and yield of the mask is remarkably enhanced. This is necessary particularly for the phase shift mask for the short wavelength of ArF or $F_2$ excimer laser.

According to the constitutions 2 to 6, the generation of the particles from the target plane, shield plane (including the earth shield), or a gap between the target and the earth shield can securely be prevented. Additionally, respective countermeasures according to the constitutions 2 to 6 are effective alone. However, a combination of all the countermeasures can securely prevent the generation of the particles from the target plane, the shield plane (including the earth shield) or the gap between the target and the earth shield.

According to the constitution 7, the generation of the particles from a backing plate portion can securely be prevented.

According to the constitution 8, when the peripheral edge of the substrate is shielded by the shield plate in order to prevent the film from being formed on the peripheral edge of the substrate, the particles generated by the film stripped by handling or cleaning after forming the light semi-transmission film can remarkably be reduced, and the yield of the mask is remarkably enhanced. This is necessary particularly for the phase shift mask for the short wavelength of ArF or $F_2$ excimer laser.

According to the constitution 9, the photo mask blank having few defects can be obtained.

According to the constitution 10, the total number of particles and pinholes having the diameter larger than the diameter substantially equivalent in size to the exposure wavelength for use in the blank as the mask is 0.1 or less per square centimeter. Therefore, practical use of the photo mask for the short wavelength of ArF or $F_2$ excimer laser can be realized. When the number exceeds 0.1, it is difficult to realize the practical use of the photo mask for the short wavelength of the ArF or $F_2$ excimer laser.

Additionally, even in the present situation, the mask can practically be used for KrF excimer laser, but the number of particles and pinholes is further preferably reduced. Therefore, the invention of the constitution 10 can be applied to the photo mask blank for KrF excimer laser, or particularly to some of the photo mask blanks for KrF in which a pattern finer than the conventional pattern is formed. Moreover, the invention can also be applied to a general photo mask blank, because it is preferable to further reduce the number of particles or pinholes.

Here, the substantially equivalent wavelength includes wavelength ±20%.

Additionally, the total number of particles and pinholes having a diameter larger in size than about a half of the exposure wavelength is preferably 0.1 or less per square centimeter. This range includes ½ wavelength ±20%.

According to the constitution 11, the exposure wavelength for use in the blank as the mask has a center wavelength of 193 nm or less, and the total number of particles and pinholes having a diameter larger than 0.2 μm is 0.1 or less per square centimeter. Therefore, the practical use of the photo mask for the short wavelength of the ArF or $F_2$ excimer laser can be realized. Additionally, the total number of particles and pinholes having a diameter larger than 0.15 μm, preferably larger than 0.1 μm is preferably 0.1 or less per square centimeter. This is realized depending upon a limitation of sensitivity of a defect test apparatus. In order to detect the particles and pinholes having smaller diameters, the defect test apparatus with a higher sensitivity is necessary.

According to the constitution 12, the practical use of the halftone phase shift mask for some of KrF excimer lasers in which the pattern finer than the conventional pattern is formed and for the short wavelength of the ArF or $F_2$ excimer laser can be realized.

According to the constitution 13, it is possible to manufacture the photo mask blank having few defects.

According to the constitution 14, the photo mask having few defects can be obtained, and the practical use of the photo mask for some of KrF excimer lasers in which the pattern finer than the conventional pattern is formed and for the short wavelength of the ArF or $F_2$ excimer laser can be realized.

According to the constitution 15, the photo mask having few defects, and the short exposure wavelength of the KrF excimer laser or ArF or $F_2$ excimer laser can be used to realize a fine pattern processing.

The present invention will be described hereinafter in detail.

In order to achieve the aforementioned objects, as a result of pursuing of researches, the following has been found.

Mixture of the particles into the light semi-transmission film during sputtering causes stripping of the film attached in a vacuum tank. The particles caused by the stripped film are generated from a non-sputtered portion of the target surface, a gap between the target and an electrically grounded vacuum tank inner wall (earth shield), a film attachment preventing component (shield) detachably attached to the inner wall of the vacuum tank, and the like.

In order to prevent the particles from being generated from the non-sputtered portion of the target surface, the following countermeasures are effective: (countermeasure 1) a whole-surface erosion cathode or the like is used to reduce an area of the non-sputtered portion on the target; (countermeasure 2) the non-sputtered portion (non-erosion portion) of the target surface is shielded by a shield member; and (countermeasure 3) the non-sputtered portion (non-erosion portion) of the target surface is roughened by blast treatment (treatment for mechanically/physically roughening the surface).

The present invention will be described hereinafter with reference to FIGS. 1 and 2, but these are drawings for simple description of positions to be subjected to the countermeasures, and the apparatus of the present invention is not limited to forms (e.g., shapes and positional relation (distance) of the respective portions) of these drawings.

The generation of the particle from a gap 13 between a target 5 and an earth shield 12 raises a problem, when the whole-surface erosion cathode is used and the end of the target is not shielded with a shield member or the like. In order to prevent the particle from being generated from this gap, the following countermeasures are effective: (countermeasure 4) a portion of a corner 5a in the end of the target is formed into a curved surface (R processed); (countermeasure 5) the blast treatment or another method is used to roughen a target end 5b; (countermeasure 6) the blast treatment or another method is used to roughen exposed backing plate surfaces 4a, 4b; (countermeasure 7) a corner 12a of the earth shield is R-processed; (countermeasure 8) the surface of the earth shield 12 is roughened by the blast treatment or another method; and (countermeasure 9) the earth shield 12 is disposed above a target plane d (on a side of the backing plate 4).

In order to prevent the particle from being generated from the shield portion, (countermeasure 10) improvement of a shield shape is effective as described later.

A formation speed t of the film attached to the shield disposed in the vacuum tank can qualitatively be represented by the equation (i) developed by the present inventor.

$$t = \cos \theta_1 \times \sin (\theta_1 - \theta_2)/r^2 \quad \text{(i)}$$

Here, respective variables in the equation (i) will be described with reference to FIG. 1. Variable r denotes a distance between a target center a and a shield position c, $\theta_1$ denotes an angle of a line connecting the target center a to the shield position c with respect to a normal e of the target plane, $\theta_2$ denotes an angle of a shield plane 11 with respect to the normal e of the target plane, and t denotes the relative film formation speed in the shield position c defined by r and $\theta_1$. Additionally, the shield 11 has a leaf shape in FIG. 1, but the shield 11 may have the leaf shape or a block shape. Moreover, the shield 11 is electrically insulated from the earth shield 12, the earth shield 12 may be earthed, and a voltage may be applied to the shield 11.

In the shield position c in the vicinity of the target 5 (area in which a value of r is smaller than a distance to the transparent substrate with the light semi-transmission film to be formed thereon), it is effective for prevention of the particle generation to design the shape of the shield 11 so that the relative film formation speed t in the equation (i) is prevented from being larger than the value in the position on the substrate. In order to satisfy the aforementioned conditions, it is necessary to set a sufficient distance (set r to be large) between the shield position c to which many films are attached ($\theta_1$ is small) and the target 5 (i.e., the shield 11 in the vicinity of the target is disposed apart from the target). It is also necessary to reduce an angle $\theta_3$ of the shield plane in the shield position in the vicinity of the target 5 (with small r) with respect to the target plane d (set $\theta_2$ to be large and close to $\theta_1$) (i.e., set the shield plane in the vicinity of the target to be horizontal with the target plane d).

In order to prevent the particle from being generated from the shield portion, (countermeasure 11) to remove (R process) a sharp corner or a sharp screw from a portion to which the film is attached on the shield, and (countermeasure 12) to roughen the surface of the shield by the blast treatment or the like are effective.

Additionally, (countermeasure 13) to hold the shield to which the film is attached by heating at a constant temperature is also effective as means for reducing the particle generated from the shield.

Here, the shield (including the earth shield) in the vicinity of the target is heated by a plasma generated on the target or a sputtered particle from the target. When film formation start and end are repeated, temperature on the shield changes, and stress of the film attached to the shield changes with a temperature change. When the film stress on the shield changes, the film is cracked or stripped, and therefore the particle is mixed into the light semi-transmission film. When the shield is held at constant temperature, the stress of the film is also kept to be constant, and the particles generated from the shield decrease. Optimum temperature of the shield changes with the material of the shield or the type of the film. However, in the present invention, when temperature of the shield is controlled to 160° C. from 100° C., the number of particles mixed in the light semi-transmission film can be reduced.

When the target surface is directed upwards, the particle adheres to the target surface, this causes abnormal electric discharge, a micro groove and hole are formed in the target surface by the abnormal electric discharge and the abnormal electric discharge is repeated. The film attached to the particle adhering to target surface or the fine groove or hole is heated by the plasma in the vicinity of the target, evaporation and burst are caused, and the particle or impurity is mixed in the light semi-transmission film. On the other hand, when the target surface is directed downwards, the particle does not easily adhere to the target surface, and therefore the abnormal electric discharge does not easily occur. Therefore, in order to form the light semi-transmission film having few particles, a sputter down system in which the target surface is directed downwards is preferable.

Additionally, the particle is sometimes generated by film stripping caused by handling or cleaning after formation of the light semi-transmission film. To prevent this, as shown in FIG. 2, there is (countermeasure 15) a method of disposing the shield plate for shielding a portion 6a for holding a transparent substrate 6 before and after the film formation, and forming no light semi-transmission film on this portion.

Additionally, during attaching of the substrate to the substrate holder, the shield plate can preferably be retreated to a position in which the attaching of the substrate is not inhibited. Moreover, the shield plate is preferably movable so that a clearance between the surface of the substrate with the film formed thereon and the shield plate can be adjusted with high precision (e.g., precision of about 0.1 mm) after attaching the substrate to the substrate holder.

The countermeasures for preventing the particle from being generated in the sputtering apparatus for forming the light semi-transmission film have mainly been described above. However, (countermeasure 16) to automate handling until introducing of the transparent substrate into the sputtering apparatus with a mechanism having little particle generation, or to set an atmosphere of a substrate introduction portion to be in a dust-free state is essential for preventing the particle generation.

DETAILED DESCRIPTION OF THE PREFERRED EMBODIMENTS

Examples of the present invention will be described hereinafter in further detail.

Figure 3:
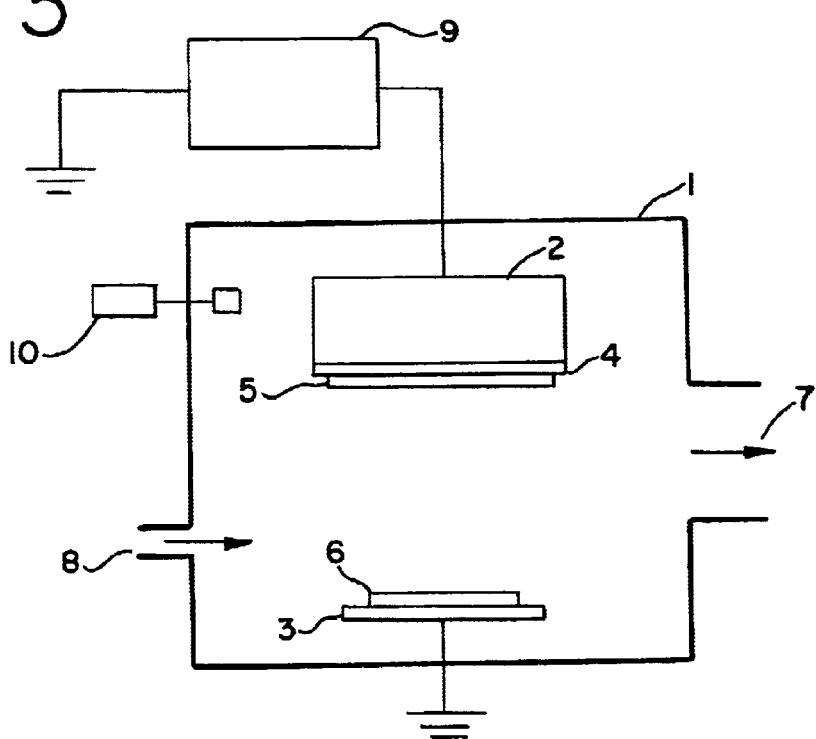
FIG. 3 is a schematic diagram of the DC magnetron sputtering apparatus for use in an embodiment.
Figure 4:
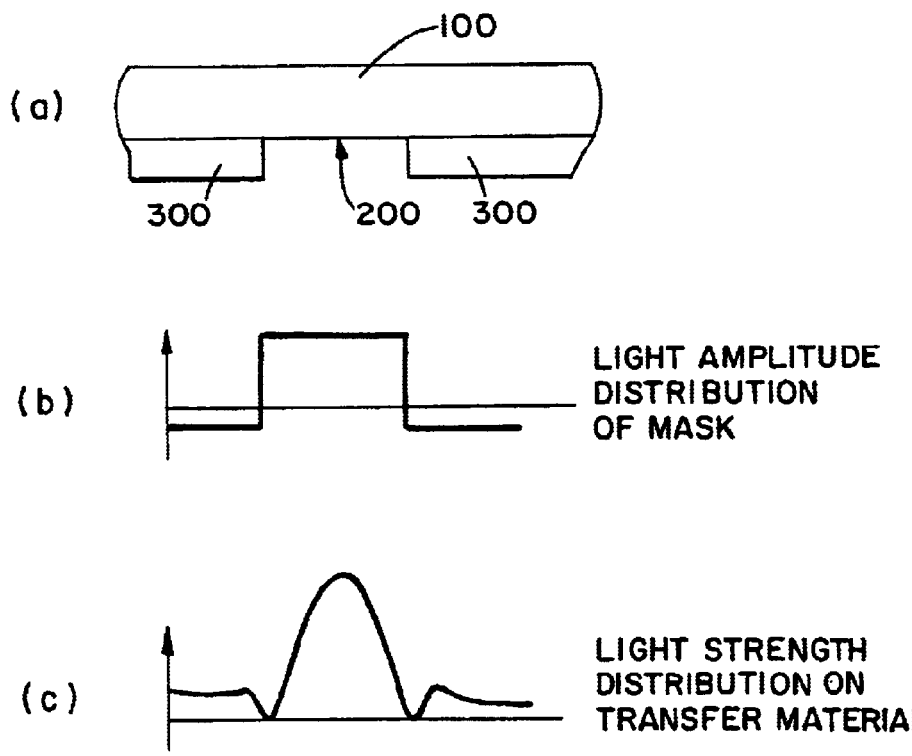
FIG. 4 is an explanatory view of transfer principle of a halftone phase shift mask.

A DC magnetron sputtering apparatus shown in FIG. 3 was used, a combination of particle countermeasures shown in Table 1 is changed as shown in Table 2, and halftone phase shift mask blanks for ArF excimer laser (193 nm) were prepared.

Concretely, a mixed target (Mo:Si=8:92 mol %) of molybdenum (Mo) and silicon (Si) was used to form a nitrided thin film (film thickness of about 670 angstroms) of molybdenum and silicon (MoSiN) on a transparent substrate by reactive sputtering (DC sputtering) in a mixed gas atmosphere (Ar:$N_2$=10%:90%, pressure: 0.1 Pa) of argon (Ar) and nitrogen ($N_2$). In this manner, the phase shift mask blank (film composition: Mo:Si:N=7:45:48) for ArF excimer laser (wavelength of 193 nm) was obtained.

Here, the DC magnetron sputtering apparatus shown in FIG. 3 has a vacuum tank 1. A magnetron cathode 2 and substrate holder 3 are disposed in the vacuum tank 1. The sputtering target 5 bonded to the backing plate 4 is attached to the magnetron cathode 2. In the example, oxygen-free steel is used in the backing plate 4, and indium is used to bond the sputtering target 5 to the backing plate 4. The backing plate 4 is directly or indirectly cooled by a water cooling mechanism. The magnetron cathode 2, backing plate 4 and sputtering target 5 are electrically connected to one another. The transparent substrate 6 is attached to the substrate holder 3.

The vacuum tank 1 is evacuated by a vacuum pump via an exhaust port 7. An atmosphere in the vacuum tank reaches a degree of vacuum which does not influence a property of the formed film, a mixed gas containing nitrogen is then introduced via a gas introduction port 8, a DC power supply 9 is used to apply a negative voltage to the magnetron cathode 2, and sputtering is performed. The DC power supply 9 has an arc detecting function, and can monitor an electric discharge state during sputtering. A pressure inside the vacuum tank 1 is measured by a pressure gauge 10.

A transmittance of a light semi-transmission film formed on the transparent substrate is adjusted by a type and mixture ratio of gases introduced via the gas introduction port 8. When the mixed gas contains argon and nitrogen, the transmittance is increased by increasing a ratio of nitrogen. When a desired transmittance cannot be obtained by adjusting the ratio of nitrogen, oxygen is added to the mixed gas containing nitrogen, and the transmittance can further be increased.

A phase angle of the light semi-transmission film was adjusted by a sputtering time, and the phase angle in an exposure wavelength was adjusted to about 180°.

Figure 1:
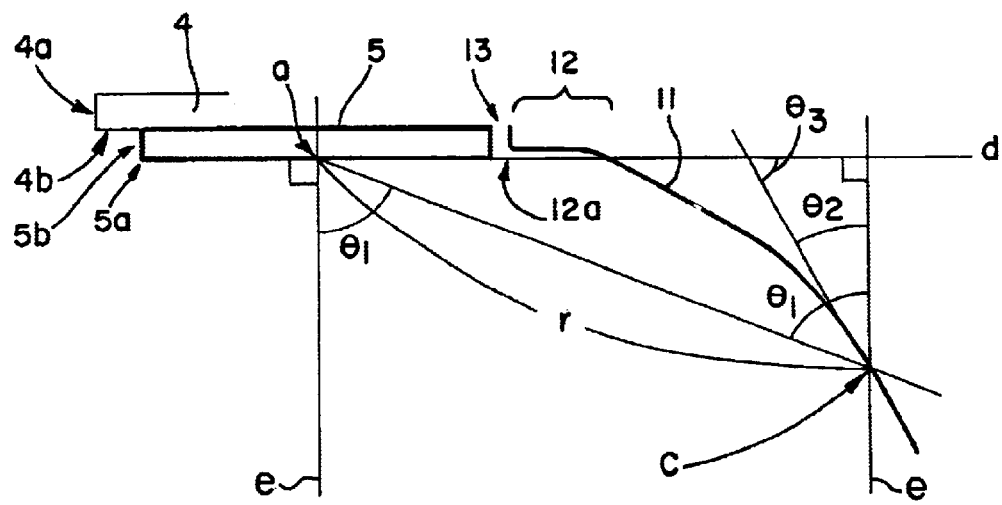
FIG. 1 is a schematic diagram of a main part showing a countermeasure portion of the present invention in a DC magnetron sputtering apparatus.
Figure 2:
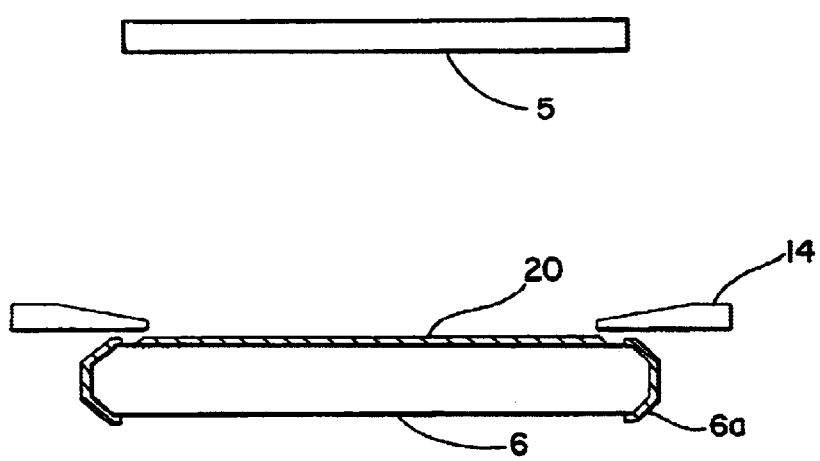
FIG. 2 is a schematic diagram of a main part showing the countermeasure portion of the present invention in the DC magnetron sputtering apparatus.

In the example, as shown in FIG. 2, a range of about 2 mm from the end of a film formed surface of the transparent substrate 6 disposed opposite to the sputtering target 5 is covered with a shield plate 14, so that a light semi-transmission film 20 is prevented from being formed on the holding portion 6a. Additionally, the holding portion 6a in FIG. 2 is crosshatched to show the portion, but naturally the light semi-transmission film is not formed on the holding portion 6a.

Evaluation

A defect test apparatus (manufactured by KLA-Teucor Co.: KT-353UV) was used to check numbers of particles and pinholes with diameters of 0.2 μm or more after the film formation, and numbers of particles and pinholes with diameters of 0.2 μm or more after the cleaning with respect to an area of 174.2 cm$^2$ in the phase shift mask blanks (size: 152 mm square) obtained as described above. Results are shown in Table 2.

TABLE 1

| Countermeasure No. | Particle countermeasure |
|---|---|
| 1 | Use whole-surface erosion cathode |
| 2 | Mask non-erosion portion |
| 3 | Blast treatment of non-erosion portion |
| 4 | R-process target end |
| 5 | Blast treatment of target end surface |
| 6 | Blast treatment of backing plate |
| 7 | R-process earth shield |
| 8 | Blast treatment of earth shield |
| 9 | Improve earth shield plane position |
| 10 | Improve shield shape |
| 11 | R-process shield surface, remove screw |
| 12 | Blast treatment of shield surface |
| 13 | Shield temperature control |
| 14 | Sputter down system |
| 15 | Shield substrate periphery |
| 16 | Automate substrate introduction, bring introduction portion to dust-free state |

TABLE 2

| | Effect of particle countermeasure | | | |
|---|---|---|---|---|
| | After film formation | | After cleaning | |
| Countermeasure No. | Particles (0.2 μm or more) | Pinholes (0.2 μm or more) | Particles (0.2 μm or more) | Pinholes (0.2 μm or more) |
| 8, 12, 14 | 6311 | many | 3304 | many |
| 8, 12, 14, 13 | 2836 | many | 1329 | many |
| 8, 12, 14, 13, 1 | 1029 | many | 448 | many |
| 8, 12, 14, 13, 2, 3 | 1144 | many | 456 | many |
| 8, 12, 14, 13, 1, 7 11 | 582 | many | 224 | many |
| 8, 12, 14, 13, 1, 7 11, 9, 10 | 152 | 12 | 48 | 29 |
| 8, 12, 14, 13, 1, 7 11, 9, 10, 4, 5, 6 | 72 | 8 | 21 | 12 |

TABLE 2-continued

| | Effect of particle countermeasure | | | |
|---|---|---|---|---|
| | After film formation | | After cleaning | |
| Countermeasure No. | Particles (0.2 μm or more) | Pinholes (0.2 μm or more) | Particles (0.2 μm or more) | Pinholes (0.2 μm or more) |
| 8, 12, 14, 13, 1, 7 11, 9, 10, 4, 5, 6, 15 | 65 | 2 | 13 | 7 |
| all excluding 2, 3 | 24 | 0 | 5 | 3 |

Measurement area: 174.2 cm$^2$

As seen from Table 2, with use of the apparatus in which the sputter down system (countermeasure 14), countermeasures 8, 12, 14, 13, 7, 11, 9, 10 as a mechanism for reducing the film formation onto the shield surface, and countermeasure 1 as a mechanism for reducing the film formation to a non-sputtered area on the target are taken, the numbers of particles and pinholes after cleaning are in two digits, and are rapidly reduced. Additionally, the countermeasures 10 and 13 are very effective in the mechanism for reducing the film formation onto the shield surface. Moreover, when the countermeasures 4, 5, 6 are added to the aforementioned countermeasures, the number of defects is further reduced. Furthermore, when the countermeasure 15 is further taken, the number of defects is further reduced. The countermeasure 15 for shielding the substrate periphery is very effective, because the defect can be prevented from being generated during handling of the substrate.

Moreover, with all the countermeasures (1, 4 to 16) excluding the countermeasures 2, 3, the halftone phase shift mask blank can be obtained in which the total number of particles and pinholes each having a diameter (0.2 μm or more) larger than the diameter substantially equivalent in size to the exposure wavelength (193 nm) is preferably 0.1 or less per square centimeter.

Moreover, it is seen that the individual countermeasures are effective, because the number of particles or pinholes decreases.

Additionally, in the conventional mask blanks for i-ray, or KrF excimer laser, in which the target surface is directed upwards and the film is formed in an in-line type sputtering apparatus, there are many particles or pinholes. Therefore, it has been confirmed that these blanks cannot be applied to the mask blanks for the short wavelength of the ArF or F$_2$ excimer laser.

The preferred examples of the present invention have been described above, but the present invention is not limited to the aforementioned examples.

For example, the method and apparatus of the present invention are applied to the halftone phase shift mask blanks having the light semi-transmission film in the aforementioned embodiment, but the present invention is not limited to the embodiment. For example, the method and apparatus of the present invention may be applied to the photo mask blank which has a shield film formed of chromium or a chromium compound.

Additionally, molybdenum was used as a metal constituting the light semi-transmission film, but this is not limited, and zirconium, titanium, vanadium, niobium, tantalum, tungsten, nickel, palladium, and the like can be used.

Moreover, the target of molybdenum and silicon was used as the target containing metal and silicon, but this is not limited. In the target containing metal and silicon, molybdenum is particularly superior among the aforementioned metals in controllability of the transmittance and in that a target density increases and particles in the film can be reduced with use of the sputtering target containing metal and silicon. Titanium, vanadium, and niobium are superior in resistance to an alkaline solution, but slightly inferior to molybdenum in the target density. Tantalum is superior in the resistance to the alkaline solution and target density, but slightly inferior to molybdenum in the controllability of transmittance. Tungsten has properties similar to those of molybdenum, but is slightly inferior to molybdenum in an electric discharge property during sputtering. Nickel and palladium are superior in the optical property and resistance to the alkaline solution, but dry etching is slightly difficult to perform. Zirconium is superior in the resistance to the alkaline solution, but inferior to molybdenum in the target density, and the dry etching is slightly difficult to perform. Considering these, molybdenum is most preferable at present. Molybdenum is also preferable for a nitrided molybdenum and silicon (MoSiN) thin film (light semi-transmission film) in superior chemicals resistance such as acid resistance and alkali resistance.

Furthermore, in order to obtain the thin film of a composition in which electric discharge stability is secured during film formation and various properties of the phase shift mask are satisfied, the target containing 70 to 95 mol % of silicon, and metal is preferably subjected to DC magnetron sputtering in the atmosphere containing nitrogen. Thereby, the light semi-transmission film containing nitrogen, metal and silicon is preferably formed.

When the content of silicon in the target is larger than 95 mol %, a voltage is not easily applied (electricity is not easily passed) to a target surface (erosion portion) in the DC sputtering, and the electric discharge becomes unstable. Moreover, when the content of silicon is less than 70 mol %, the film constituting a light semi-transmission portion with a high transmittance cannot be obtained. Furthermore, electric discharge stability is further enhanced by combination of the nitrogen gas with the DC sputtering.

Additionally, the electric discharge stability during film formation also influences film quality. When the electric discharge stability is superior, the light semi-transmission film with a satisfactory film quality is obtained.

Furthermore, in the manufacturing apparatus and method of the present invention, there can be provided a constitution in which the transparent substrate is disposed opposite to the target with a certain angle, the substrate is rotated, and the film is formed by inclined sputtering.

As described above, according to the phase shift mask blank of the present invention, the total number of particles and pinholes each having a diameter (particularly larger than 0.2 μm) larger than the diameter substantially equivalent in size to the exposure wavelength in the light semi-transmission film is preferably 0.1 or less per square centimeter. Therefore, the practical use of the phase shift mask for the short wavelength of the ArF or $F_2$ excimer laser can be realized.

Moreover, according to the manufacturing apparatus and method of the phase shift mask blank of the present invention, it is possible to manufacture the phase shift mask blank in which the total number of particles and pinholes each having a diameter (particularly larger than 0.2 μm) larger than the diameter substantially equivalent in size to the exposure wavelength in the light semi-transmission film is preferably 0.1 or less per square centimeter.

Furthermore, according to the present invention, there can be provided the photo mask blank in which the number of particles or pinholes is reduced as much as possible.

Additionally, there can be provided the manufacturing apparatus and method able to manufacture the photo mask blank in which the number of particles or pinholes is reduced as much as possible.

What is claimed is:

1. A manufacturing method of a photo mask blank having a thin film for forming a pattern on a transparent substrate, comprising steps of:
    directing the surface of a target downwards and the surface of a substrate upwards with respect to a gravity direction; shielding a peripheral edge of said substrate to prevent the film from being formed on the peripheral edge; and sputtering/forming said thin film.

2. A manufacturing method of a photo mask blank having a thin film for forming a pattern on a transparent substrate, comprising a step of:
    manufacturing said thin film using a DC magnetron sputtering apparatus comprising at least a sputtering target, a magnetron cathode with the target attached thereto, a substrate holder disposed opposite to said target, and a shield disposed on an inner wall of a vacuum tank inside the vacuum tank,
    wherein the surface of a target is directed downwards with respect to a gravity direction, and
    the apparatus has a mechanism for reducing film formation on a non-sputtered area on the target and the surface of the shield.

3. The manufacturing method according to claim 2 wherein said mechanism for reducing the film formation onto the non-sputtered area on the target comprises a mechanism in which a whole-surface erosion cathode is used as the magnetron cathode, a mechanism for shielding the non-sputtered area on the target, or a mechanism for roughening the surface of a non-sputtered portion on the target.

4. The manufacturing method according to claim 3 wherein said mechanism for reducing the film formation onto the non-sputtered area on the target further comprises a mechanism for forming a corner in the target into a curved surface, and roughening an end surface of the target.

5. The manufacturing method according to claim 2 wherein the mechanism for reducing the film formation on the shield surface keeps the shield at a constant temperature, and a shape of the shield is designed so that a relative film formation speed t in the following equation (i) in at least a shield position in the vicinity of the target is prevented from being larger than a value in a position on the substrate:

$$t = cos\theta_1 \times Sin(\theta_1 - \theta_2)/r^2 \qquad (i)$$

(in the equation (i), r denotes a distance between a target center and a shield position, $\theta_1$ denotes an angle of a line connecting the target center to the shield position with respect to a normal of a target plane, $\theta_2$ denotes an angle of a shield plane with respect to the normal of the target plane, and t denotes the relative film formation speed in the shield position defined by r and $\theta_1$).

6. The manufacturing method according to claim 5 wherein the mechanism for reducing the film formation onto said shield surface comprises a mechanism for forming a corner in the shield into a curved surface, roughening the surface of the shield, and disposing an earth shield above the target plane.

7. The manufacturing method according to claim 2 wherein the apparatus further comprises a backing plate to which the target is to be attached, and the surface of the backing plate is roughened.

8. The manufacturing method according to claim 2 wherein the apparatus further comprises a shield plate for preventing the film from being formed on a peripheral portion of the substrate.

9. A photo mask blank having a thin film for forming a pattern on a transparent substrate, wherein a total number of particles and pinholes having a diameter larger than a diameter equivalent in size to an exposure wavelength for use in said blank as a mask is 0.1 or less per square centimeter.

10. A photo mask blank having a thin film for forming a pattern on a transparent substrate, wherein an exposure wavelength for use in said blank as a mask has a center wavelength of 193 nm or less, and a total number of particles and pinholes having a diameter larger than 0.2 $\mu$m is 0.1 or less per square centimeter.

11. The photo mask blank according to claim 9 wherein said thin film for forming the pattern is a light semi-transmission film, and said photo mask blank is a halftone phase shift mask blank.

12. The photo mask blank according to claim 10 wherein said thin film for forming the pattern is a light semi-transmission film, and said photo mask blank is a halftone phase shift mask blank.

* * * * *